United States Patent
Jung et al.

(10) Patent No.: US 7,816,734 B2
(45) Date of Patent: Oct. 19, 2010

(54) FIELD-EFFECT TRANSISTOR INCLUDING LOCALIZED HALO ION REGIONS, AND SEMICONDUCTOR MEMORY, MEMORY CARD, AND SYSTEM INCLUDING THE SAME

(75) Inventors: Hyuck-Chai Jung, Gyeonggi-do (KR); June-Hee Lim, Seoul (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 112 days.

(21) Appl. No.: 12/169,137

(22) Filed: Jul. 8, 2008

(65) Prior Publication Data

US 2009/0152647 A1 Jun. 18, 2009

(30) Foreign Application Priority Data

Dec. 12, 2007 (KR) .................. 10-2007-0129056

(51) Int. Cl.
*H01L 29/06* (2006.01)
*H01L 29/36* (2006.01)
(52) U.S. Cl. .................. 257/345; 257/219; 257/404; 257/E21.618; 257/E29.063
(58) Field of Classification Search ........... 257/288, 257/345, 219, 404, E21.618, E29.063
See application file for complete search history.

(56) References Cited

U.S. PATENT DOCUMENTS

| 5,534,449 | A | * | 7/1996 | Dennison et al. | ............ 438/231 |
| 6,743,684 | B2 | | 6/2004 | Liu | |
| 7,226,843 | B2 | * | 6/2007 | Weber et al. | ................ 438/305 |

FOREIGN PATENT DOCUMENTS

| KR | 2002-0060980 | 7/2002 |
| KR | 2005-0028571 | 3/2005 |
| KR | 2006-0011747 | 2/2006 |

OTHER PUBLICATIONS

English language abstract of Korean Publication No. 2002-0060980.
English language abstract of Korean Publication No. 2005-0028571.
English language abstract of Korean Publication No. 2006-0011747.

* cited by examiner

*Primary Examiner*—Ngan Ngo
*Assistant Examiner*—Benjamin Tzu-Hung Liu
(74) *Attorney, Agent, or Firm*—Muir Patent Consulting, PLLC

(57) ABSTRACT

A field-effect transistor including localized halo ion regions that can optimize HEIP characteristics and GIDL characteristics. The field-effect transistor includes a substrate, an active region, a gate structure, and halo ion regions. The active region includes source/drain regions and a channel region formed at a partial region in the substrate. The gate structure electrically contacts the active region. The halo ion regions are locally formed adjacent to both end portions of the source/drain regions in the substrate.

20 Claims, 5 Drawing Sheets

FIELD-EFFECT TRANSISTOR INCLUDING LOCALIZED HALO ION REGIONS, AND SEMICONDUCTOR MEMORY, MEMORY CARD, AND SYSTEM INCLUDING THE SAME

CROSS-REFERENCE TO RELATED PATENT APPLICATION

This application claims the benefit of Korean Patent Application No. 10-2007-0129056, filed on Dec. 12, 2007, in the Korean Intellectual Property Office, the disclosure of which is incorporated herein by reference.

BACKGROUND

1. Field of the Invention

The present invention relates to semiconductor devices, and more particularly, to a field-effect transistor including localized halo ion regions, a semiconductor memory, a memory card, and a system including the field-effect transistor.

2. Description of the Related Art

With high integration of semiconductor devices, transistor size and gate linewidth decrease and an applied electric field increases as a result of an increase in the impurity concentration in source/drain regions. Short channel effect also increases with a decrease in channel length, and accordingly, the punch-through margin decreases. The punch-through margin decreases as a result of both a decrease in the gate linewidth, and an increase in the dose difference between both ends of the source/drain regions and a channel region between the source/drain regions.

When a high Vpp voltage is applied to a PMOS transistor three characteristics must be considered: hot electron induced punch-through (HEIP), gate induced drain leakage (GIDL), and performance. The combination of these three characteristics is difficult to optimize, because they are dependent upon each other.

Figure 1:
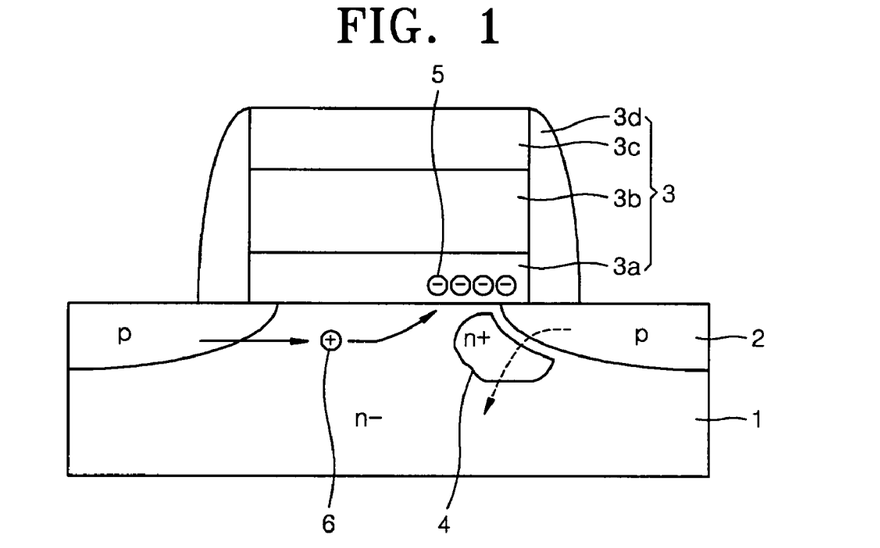
FIG. 1 is a cross-sectional view of a conventional field-effect transistor, which illustrates HEIP and GIDL in the field-effect transistor.

FIG. 1 is a cross-sectional view of a conventional field-effect transistor, which illustrates the HEIP and GIDL characteristics in the field-effect transistor.

Referring to FIG. 1, due to the HEIP characteristics, hot electrons 5 are trapped in the bottom portion of a gate structure 3 and obstruct the movement of holes 6, which are main carriers in a PMOS transistor, thereby increasing an off current. The HEIP characteristics can be improved by increasing a gate length or by forming halo ion regions. However, increasing the gate length degrades the transistor performance. Forming halo ion regions has the additional effect of increasing an electromagnetic field, and thus increases a GIDL. These characteristics are indicated by arrows in FIG. 1.

The above problem can be solved by increasing a gate critical dimension (CD) in the end portion of a gate of the active region because the electron trap due to the HEIP characteristics generally occurs in the end portion of the active region. This solution, however, will reduce a downscaling margin.

SUMMARY

The present invention provides a field-effect transistor including localized halo ion regions that can optimize HEIP characteristics and GIDL characteristics.

The present invention also provides a semiconductor memory including a field-effect transistor having localized halo ion regions that can optimize HEIP characteristics and GIDL characteristics.

The present invention also provides a memory card and a system that includes a memory having the above field-effect transistor.

An embodiment of the present invention provides a field-effect transistor including: a substrate; an active region including source/drain regions and a channel region formed at a partial region in the substrate; a gate structure electrically contacting the active region; and halo ion regions locally formed adjacent to both end portions of the source/drain regions in the substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Reference will now be made in detail to example embodiments, which are illustrated in the accompanying drawings. However, example embodiments are not limited to the embodiments illustrated hereinafter. Rather, the embodiments herein are introduced to provide an easy and complete understanding of the scope and spirit of example embodiments. In the drawings, the thicknesses of layers and regions are exaggerated for clarity.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
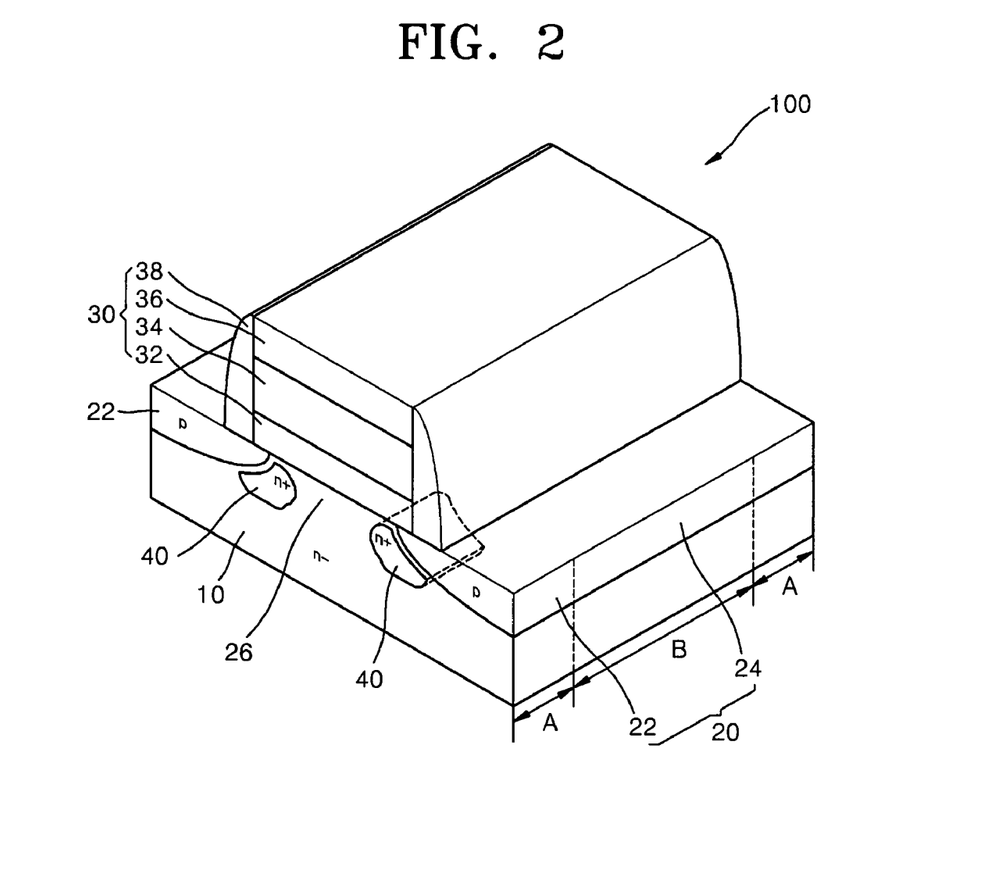
FIG. 2 is a perspective view of a field-effect transistor having localized halo ion regions according to an embodiment of the present invention.

FIG. 2 is a perspective view of a field-effect transistor 100 having localized halo ion regions 40 according to an embodiment of the present invention.

Referring to FIG. 2, the field-effect transistor 100 includes a substrate 10, an active region formed at a partial region in the substrate 10, and a gate structure 30 that electrically contacts the active region.

The substrate 10 may be any type of substrate, such as a silicon substrate, a silicon-germanium substrate, a glass substrate, or the like that can be used to form the field-effect transistor 100. The active region is generally defined by a device isolation layer (not shown), and includes a channel region 26 and source/drain regions 20.

The gate structure 30 may be formed on or partially in the substrate 10. FIG. 2 illustrates an exemplary case where the gate structure 30 is formed on the substrate 10. Also, FIG. 2 illustrates the gate structure 30 in a transistor cell structure of a general dynamic random access memory (DRAM), which includes a gate insulating layer 32, a gate electrode 34, a capping layer 36, and a spacer 38. This, however, is merely exemplary and is not intended to limit the present invention in any way. Those skilled in the art will readily understand that the gate structure 30 may also be a gate structure of a non-volatile memory including a tunneling insulation layer, a charge storage layer, a blocking insulation layer, and a gate electrode.

As one of the technical features of the present invention, the field-effect transistor 100 includes halo ion regions 40 that are locally formed adjacent to the both end portions 22 of the source/drain regions 20 in the substrate 10. That is, the halo ion regions 40 are formed in regions A corresponding to both end portions 22 of the source/drain regions 20 in the longitudinal direction of the gate structure 30. The halo ion regions 40 are not formed in regions B, corresponding to the middle portions 24 of the source/drain regions 20. The halo ion regions 40 will be described below in detail in association with a method of forming thereof.

The source/drain region 20 and the halo ion region 40 may include impurities (dopants) of opposite conductivity types. For example, the source/drain region 20 may comprise a PMOS transistor including p-type impurities, and the halo ion region 40 may include n-type impurities. Alternatively, the source/drain region 20 may constitute an NMOS transistor including n-type impurities, and the halo ion region 40 may include p-type impurities. However, the localized halo ion regions 40 are more effective when the source/drain regions 20 are part of a PMOS transistor, where holes are the main carriers. P-type impurities may include all types of impurities that create holes as main carriers. For example, p-type impurities may include one or more elements such as boron (B), aluminum (Al), gallium (Ga), indium (In), thallium (Tl), and the like that are Group III elements. N-type impurities may include all types of impurities that create electrons as main carriers. For example, n-type impurities may include one or more elements such as nitrogen (N), phosphorus (P), arsenic (As), antimony (Sb), bismuth (Bi), and the like that are Group V elements. The halo ion region 40 may have an impurity concentration ranging from about $1E13$ ions/cm$^2$ to about $1E15$ ions/cm$^2$.

The channel region 26 may include the same type of impurities as the halo ion region 40. That is, the channel region 26 may include p-type impurities when the halo ion region 40 includes p-type impurities; and the channel region 26 may include n-type impurities when the halo ion region 40 includes n-type impurities. Also, the channel region 26 may have a lower impurity concentration than the halo ion region 40. FIG. 2 illustrates a PMOS transistor in which the source/drain regions 20 include p-type impurities and the halo ion region 40 and the channel region 26 include n-type impurities. An impurity concentration n+ of the halo region 40 is higher than an impurity concentration n– of the channel region 26. It is obvious to those skilled in the art that n+ and n– denote a relative concentration difference, and n+ denotes a higher concentration than n–.

As described above, the halo ion regions 40 are formed only in regions A corresponding to both end portions 22 of the source/drain regions 20 in the longitudinal direction of the gate structure 30. The halo ion regions 40 are not formed in region B, which corresponds to the middle portions 24 of the source/drain regions 20. In the vertical direction from the gate structure 30 to the substrate 10, the halo ion regions 40 may be formed adjacent to both end portions 22 of the source/drain regions 20. Alternatively, the halo ion regions 40 may be formed adjacent to the both end portions 22 of the source/drain regions 20, extending from the lower portions of the outer regions to the surface of the substrate 10 contacting the gate structure 30 (not shown). This, however, is merely exemplary, and is not intended to limit the present invention in any way. Also, unlike the illustration of FIG. 2, the halo ion regions 40 may be formed adjacent to only one of the source/drain regions 20.

Although not shown in FIG. 2, the field-effect transistor 100 may further include a lightly doped drain (LDD) region (not shown) that includes the same type impurities as the source/drain regions 20 at a lower impurity concentration. The LDD region may be formed adjacent to the surface of the substrate 10 and the source/drain regions 20 in the substrate 10. The halo ion regions 40 may be formed under the LDD region, adjacent to the source/drain regions 20. This, however, is merely exemplary, and is not intended to limit the present invention in any way.

Figure 3:
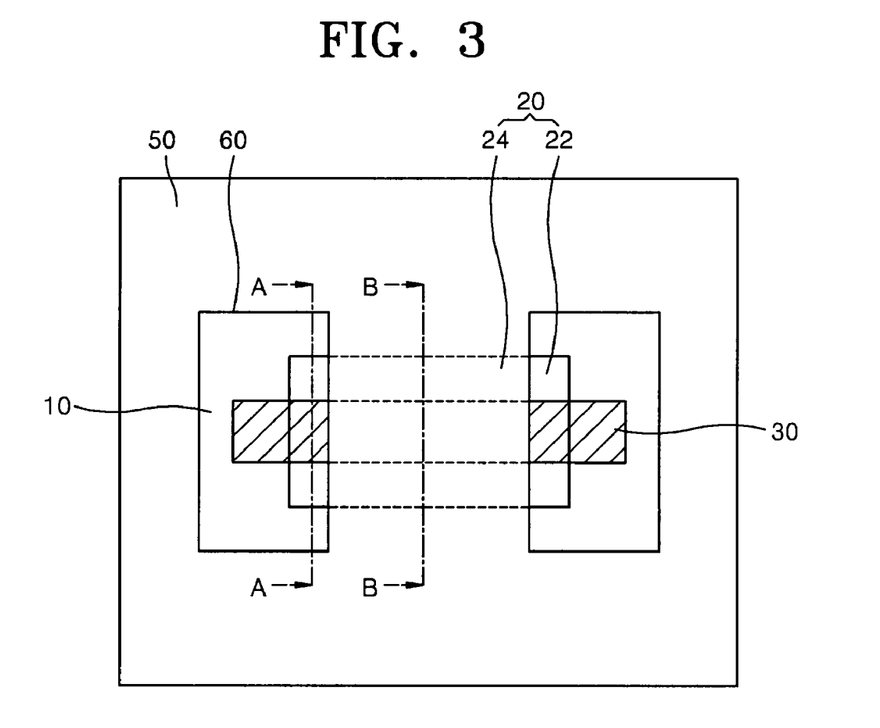
FIG. 3 is a plan view illustrating a mask pattern that is formed on a gate structure to expose portions of source/drain regions in order to form the localized halo ion regions of FIG. 2.

FIG. 3 is a plan view illustrating a mask pattern that is formed on the gate structure 30 so as to expose portions of the source/drain regions 20 in order to form the localized halo ion regions 40 shown in FIG. 2.

Referring to FIG. 3, a mask 50 is formed on the substrate 10 where the source/drain regions 20 and the gate structure 30 have been formed. The mask 50 may be a photoresist mask, a general hard mask, or the like. The mask 50 is used to form the halo ion regions 40, and is composed of a material that is resistant to ion implantation.

The gate structure 30 may be a structure that has all gate components (e.g., the gate insulating layer 32, the gate electrode 34, the capping layer 36, and the spacer 38) formed therein. Alternatively, the gate structure 30 may have only some of all the gate components formed therein and may be completed by forming the remaining components after forming the halo ion regions 40. The gate structure 30 may be, for example, a gate structure of a nonvolatile memory or may be a gate structure of any other type of semiconductor device.

Thereafter, the mask 50 is patterned to form a mask pattern 60 to expose both end portions 22 of the source/drain regions 20. Ion implantation is then performed to form the halo ion regions 40 adjacent to both end portions 22 of the source/drain regions 20 in the substrate 10.

Figure 4:
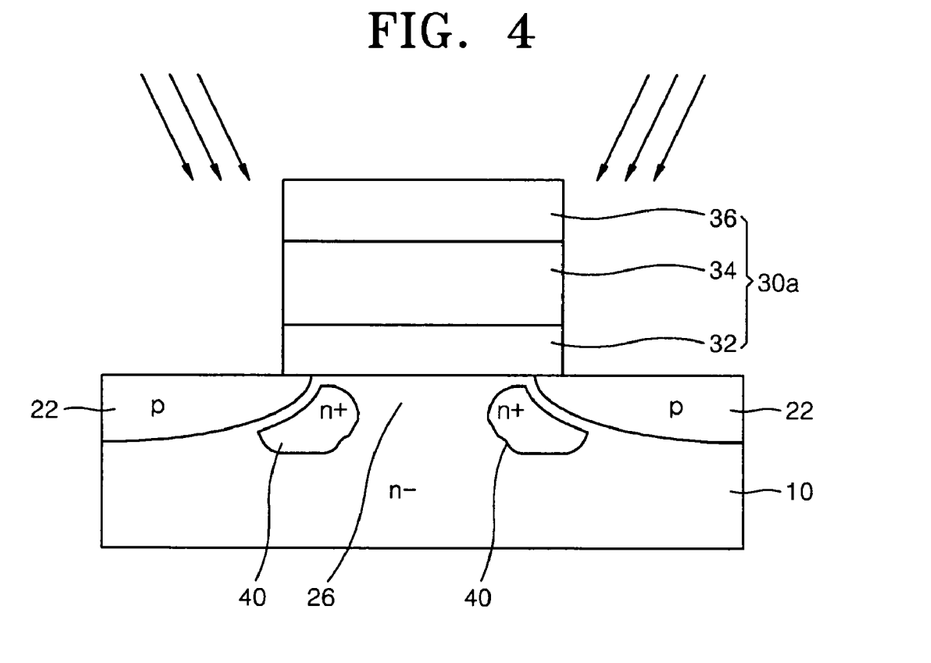
FIG. 4 is a cross-sectional view taken along a line A-A of FIG. 3.
Figure 5:
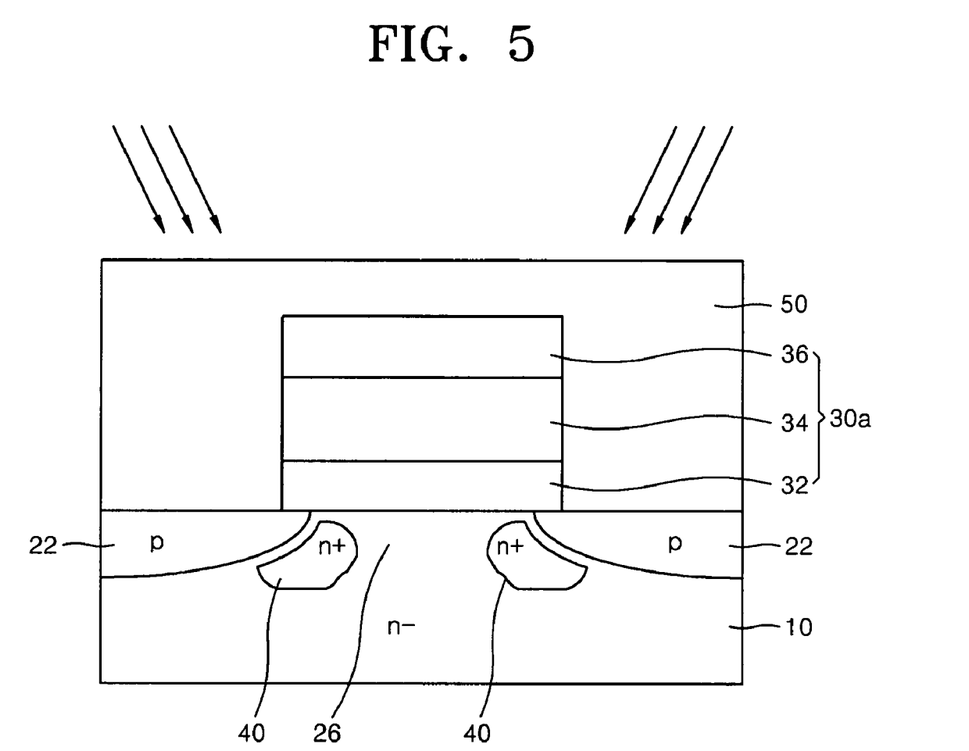
FIG. 5 is a cross-sectional view taken along a line B-B of FIG. 3.

FIG. 4 is a cross-sectional view taken along a line A-A of FIG. 3, which corresponds to both end portions 22 of the source/drain regions 20. FIG. 5 is a cross-sectional view taken along a line B-B of FIG. 3, which corresponds to the middle portions 24 of the source/drain regions 20. In FIGS. 4 and 5, arrows denote ions that are implanted into the substrate 10 in order to form the halo ion regions 40.

Referring to FIGS. 4 and 5, because the regions corresponding to both end portions 22 of the source/drain regions 20 are exposed through the mask pattern 60, the regions are exposed to ions implanted through the mask 50. Thus, the ions are implanted into substrate regions adjacent to the both end portions 22 of the source/drain regions 20 forming the halo ion regions 40 in the substrate. On the other hand, the regions corresponding to the middle portions 24 of the source/drain region 20 are not exposed to the ions implanted through the mask 50. Thus halo ion regions 40 are not formed in the regions corresponding to the middle portions 24.

FIGS. 4 and 5 illustrate that the ion implantation, used to form the halo ion regions 40, is performed after forming the gate structure 30a and the capping layer 36, and after forming the source/drain regions 20. This, however, is merely exemplary and is not intended to limit the present invention in any way. That is, the ion implantation may be performed after forming only the gate insulating layer 32 or before forming the source/drain regions 20. Alternatively, the ion implantation may be performed after forming the spacer (38 of FIG. 2).

The ion implantation, used to form the halo ion regions 40, may be performed using a general ion implanter (not shown) and a general ion implantation process. An ion implantation angle may be any angle capable of forming the halo ion regions 40. The ion implantation angle may vary depending on the height of the gate structure 30, the interval between the gate structures 30, the size of the halo ion region 40, or the position of the halo ion region 40 in the substrate 10. For example, the ion implantation angle may range from about 5° to about 85° with respect to the vertical axis of the substrate 10. Alternatively, the ion implantation angle may range from about 5° to about 45° with respect to the vertical axis of the substrate 10. This, however, is merely exemplary and not intended to limit the present invention in any way. Ion implantation energy and impurity concentration of the halo ion region 40 may be in any range capable of forming the halo ion region 40. For example, the ion implantation energy may range from about 10 KeV to about 50 KeV, and the impurity concentration of the halo ion region 40 may range from about 1E13 ions/cm$^2$ to about 1E15 ions/cm$^2$. This, however, is merely exemplary and not intended to limit the present invention in any way.

Figure 6:
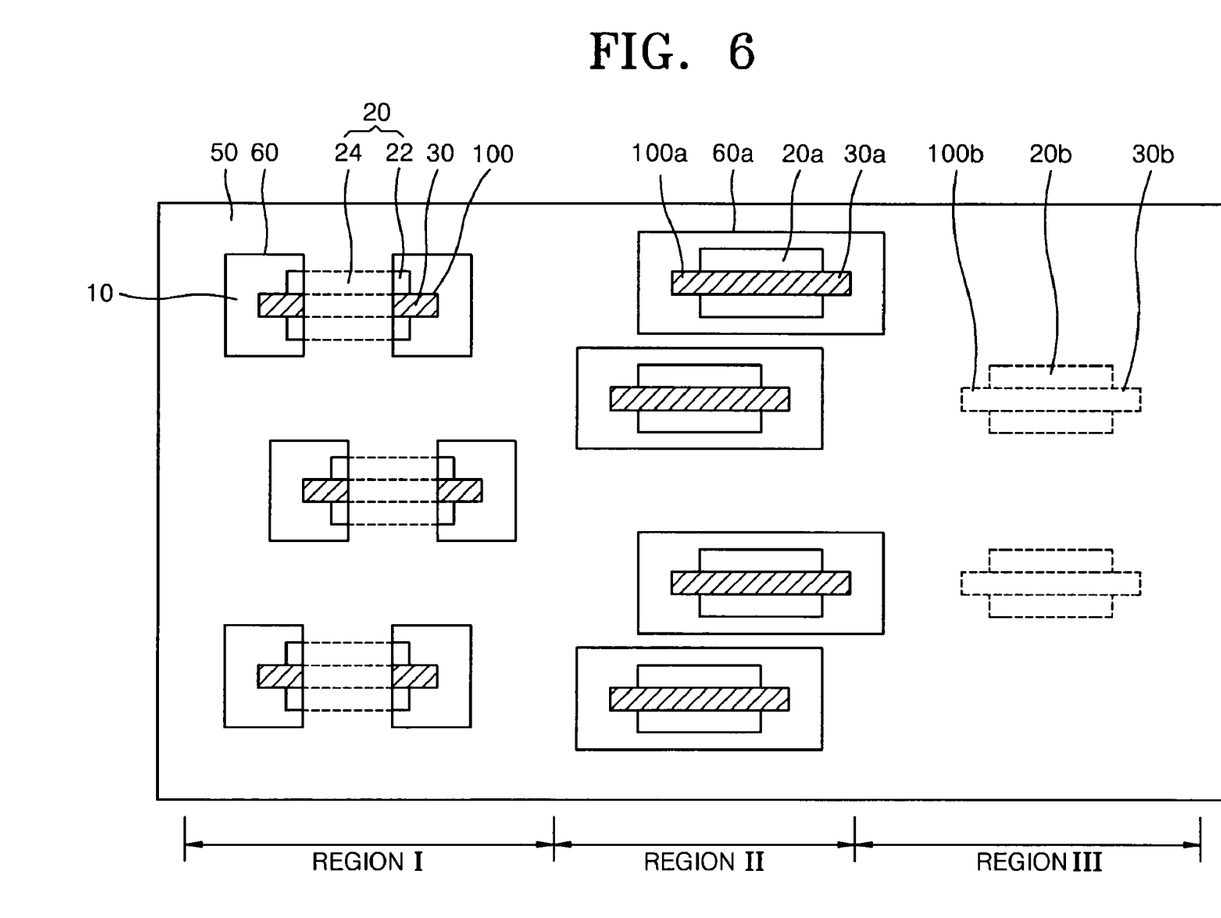
FIG. 6 is a plan view illustrating a method of forming a memory including a field-effect transistor having localized halo ion regions according to an embodiment of the present invention.

FIG. 6 is a plan view illustrating a method of forming a memory including a field-effect transistor 100 having localized halo ion regions according to an embodiment of the present invention. An overlapping description with respect to the above description will be omitted for a simple and clear description of the present invention.

In general, a memory includes multiple transistors in a cell region and a peripheral region. The transistors are a mixture of NMOS transistors and PMOS transistors. A memory may include a transistor having a localized halo ion region as described above, a transistor having an overall halo ion region, or a transistor having no halo ion region.

Referring to FIG. 6, a memory according to an embodiment of the present invention includes a substrate 10, a plurality of active regions, each including source/drain regions 20, a channel region 26 (see FIG. 2) formed at a partial region in the substrate 10, a plurality of field-effect transistors 100, 100a and 100b having a plurality of gate structures 20, 20a and 20b, respectively, that contact the active regions electrically.

The field-effect transistors 100, 100a and 100b are classified into three types depending on their shapes and whether halo ion regions 40 (see FIG. 2) are formed therein. As described above, first field-effect transistors 100 may each include halo ion regions 40 (see FIG. 2) that are locally formed adjacent to both end portions of the first source/drain regions 20 in the substrate 10. One or more second field-effect transistors 100a may each include second halo ion regions (not shown) that are adjacent to the second source/drain regions 20a in the substrate 10, and are continuously formed along the longitudinal direction of the second source/drain regions 20a. One or more third field-effect transistors 100b do not include halo ion regions.

As illustrated in FIG. 6, a mask 50 is patterned to form a first mask pattern 60 and a second mask pattern 60a. As described above, the first and second field-effect transistors 100 and 100a, respectively, are exposed through the first and second mask patterns 60 and 60a. Ions are implanted through the first and second mask patterns 60 and 60a to form the first and second halo ion regions.

The third field-effect transistors 100b are covered with the mask 50. Therefore, ions are not implanted into the third filed-effect transistors 100b, and thus halo ion regions are not formed in the third filed-effect transistors 100b. Because only both end portions 22 of the first source/drain regions 20 of the first field-effect transistors 100 are exposed, the first halo ion region may be formed only in both end portions 22. On the other hand, because the second source/drain regions 20a of the second field-effect transistors 100a are entirely exposed, the second halo ion region is formed continuously along the longitudinal direction of the second source/drain regions 20a. The device, condition and method for forming the first and second halo ion regions are the same as those illustrated with reference to FIGS. 2 through 5, and thus their description will be omitted for conciseness.

FIG. 6 illustrates that the first, second, and third field-effect transistors 100, 100a and 100b are formed in regions I, II, and III, respectively. This, however, is merely exemplary and is not intended to limit the present invention in any way. That is, the first, second, and third field-effect transistors 100, 100a and 100b may be formed without discrimination between regions. Also, the first, second, and third field-effect transistors 100, 100a and 100b may be different in terms of number, orientation, or arrangement.

In the first field-effect transistors 100, the first source/drain regions 20 may include impurities having a conductivity type opposite that of the first halo ion region. In the second field-effect transistors 100a, the second source/drain regions 20a may include impurities having a conductivity type opposite that of the second halo ion region. For example, the first and second source/drain regions 20 and 20a each may comprise a PMOS transistor including p-type impurities, and the first and second halo ion regions may include n-type impurities. On the contrary, the first and second source/drain regions 20 and 20a may both constitute an NMOS transistor including n-type impurities, and the first and second halo ion regions may include p-type impurities. For example, the p-type impurities may include one or more elements such as boron (B), aluminum (Al), gallium (Ga), indium (In), thallium (Tl), and the like that are Group III elements. For example, the n-type impurities may include one or more elements such as nitrogen (N), phosphorus (P), arsenic (As), antimony (Sb), bismuth (Bi), and the like that are Group V elements. One or both of the first and second halo ion regions may have an impurity concentration ranging from about 1E13 ions/cm$^2$ to about 1E15 ions/cm$^2$.

The channel region may include the same type impurities as one or both of the first and second halo ion regions. The channel region may also have a lower impurity concentration than the first and second halo ion regions.

Although not shown in FIG. 6, one or all of the first through third field-effect transistors 100, 100a and 100b may further include a lightly doped drain (LDD) region (not shown). The LDD region may include the same type impurities as the first through third source/drain regions 20, 20a and 20b, but at a lower impurity concentration. The LDD region may be formed adjacent to the surface of the substrate 10 and the first through third source/drain regions 20, 20a and 20b in the substrate 10. The halo ion regions may be formed under the LDD region, adjacent to the first and second source/drain regions 20 and 20a. This, however, is merely exemplary and is not intended to limit the present invention in any way.

Some of the gate structures 20, 20a and 20b may be a static random access memory (SRAM) cell, or a dynamic random access memory (DRAM) cell including a gate insulating layer and a gate electrode. Alternatively, some of the gate structures 20, 20a and 20b may be of a nonvolatile memory cell including a tunneling insulation layer, a charge storage layer, a blocking insulation layer, and a gate electrode.

Although not shown in FIG. 6, memory fabrication is completed by performing subsequent processes including removing the mask 50 after forming both the halo ion regions and the gate structures.

Figure 7:
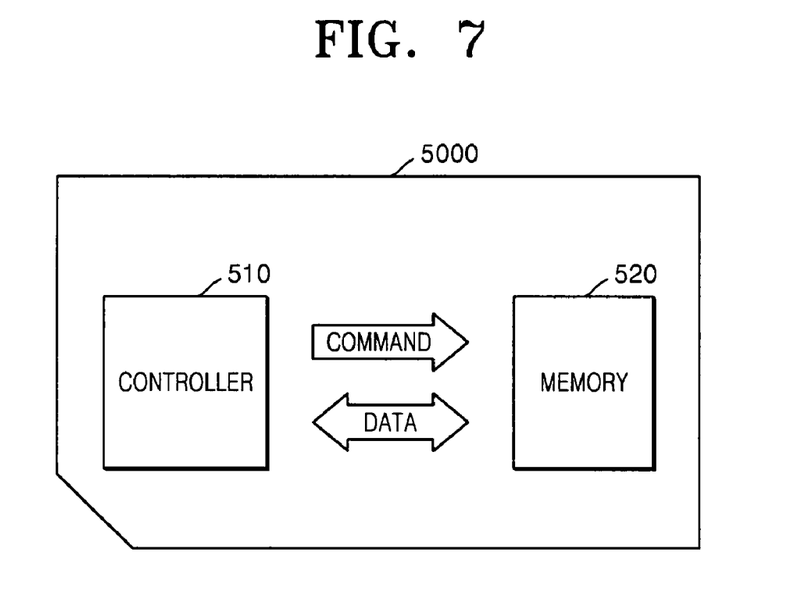
FIG. 7 is a block diagram of a memory card according to an embodiment of the present invention.

FIG. 7 is a schematic view illustrating an embodiment of a memory card 5000 according to an aspect of the present invention.

Referring to FIG. 7, a controller 510 and a memory 520 are disposed to send and receive electric signals to each other. For example, when the controller 510 gives a command to the memory 520, the memory 520 can send data. The memory 520 can include the flash memory device 100 of FIG. 3. The flash memory device, according to the various embodiments of the present invention, can be disposed in NAND or NOR architecture arrays in accordance with the logic gate design, wherein such NAND and NOR arrays are generally known in the art. The memory arrays disposed in a plurality of rows and columns can have one or more memory array banks (not shown). The memory 520 can include the memory array (not shown) or the memory array bank (not shown), all of which are known in the art. The memory card 5000 can further include conventional members, such as a conventional row decoder (not shown), a column decoder (not shown), input/output (I/O) buffers (now shown), and/or a control resistor (not shown) in order to drive the memory array bank (not shown), all of which are known in the art. The memory card 5000 can be used in memory devices such as a memory card, for example, as a memory stick card, a smart media (SM) card, a secure digital (SD) card, a mini SD card, or a multi media card (MMC).

Figure 8:
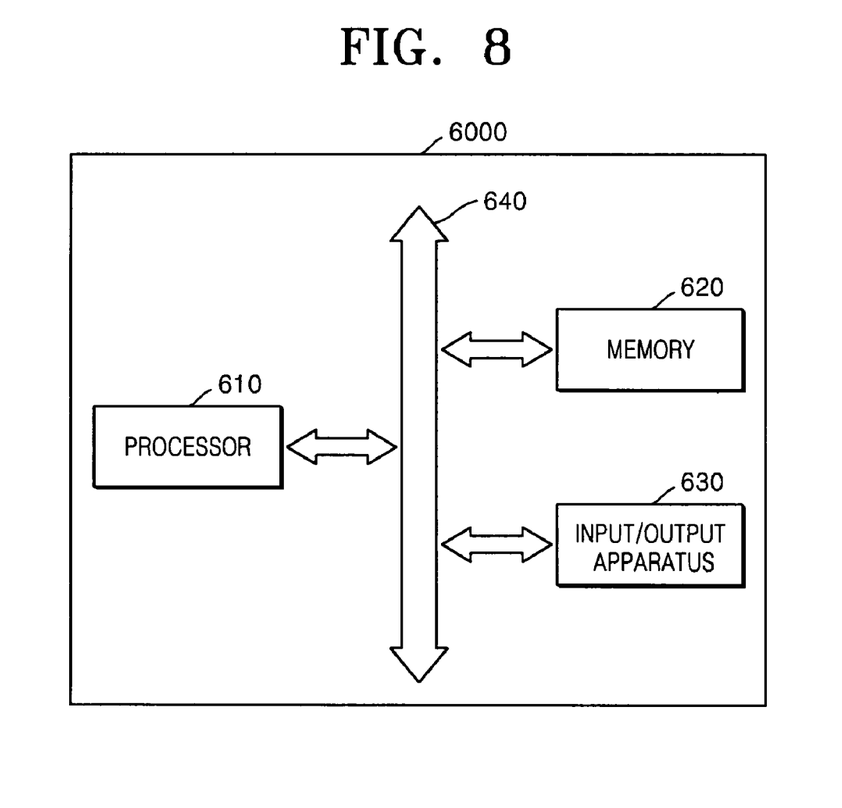
FIG. 8 is a block diagram of a system according to an embodiment of the present invention.

FIG. 8 is a schematic view illustrating an embodiment of a system 6000 according to an aspect of the present invention.

Referring to FIG. 8, a processor 610, an input/output (I/O) apparatus 630, and a memory 620 can perform data communication using a bus 640. The processor 610 executes a software program and controls the system 6000. The input/output apparatus 630 can be used to input or output data of the system 6000. The system 6000 is connected to an external apparatus, for example, a personal computer or a network, using the input/output apparatus 630 to send and receive data to and from the external apparatus. The memory 620 can include the flash memory device 100 of FIG. 3. For example, the memory 620 can store codes and data for operating the processor 610. For example, the system 6000 can be used for a mobile phone, a MP3 player, a navigation system, a portable multimedia player (PMP), a solid state disk (SSD), or a household appliance.

According to an embodiment of the present invention, the halo ion regions are locally formed only in both end portions of the active region. Therefore, the field-effect transistor, including the localized halo ion regions, the semiconductor memory, the memory card, and the system including the field-effect transistor, can optimize the HEIP characteristics and the GIDL characteristics.

Halo ion regions are used to improve the HEIP characteristics, which increase with a decrease in gate length, and cannot be formed in a PMOS transistor. According to an embodiment of the present invention, halo ion regions are formed locally in both end portions of an active region of a PMOS transistor, and not in the entire active region. Therefore, the HEIP characteristics can be improved without increasing the GIDL. Also, the transistor performance can be maintained or enhanced without increasing the gate length.

More specifically, in both end portions of the active region, including the localized halo regions, the effective gate length is increased and thus the HEIP characteristics can be improved. In the middle portion of the active region, having no halo ion region, the GIDL characteristics can be improved due to a decrease in the electromagnetic field. The on-current characteristic can be improved due to a decrease in threshold voltage.

The foregoing is illustrative of example embodiments and is not to be construed as limiting thereof. Although example embodiments have been described, those skilled in the art will readily appreciate that many modifications are possible in example embodiments without materially departing from the novel teachings and advantages of example embodiments. Accordingly, all such modifications are intended to be included within the scope of the claims. Therefore, it is to be understood that the foregoing is illustrative of example embodiments and is not to be construed as limited to the specific embodiments disclosed, and that modifications to the disclosed embodiments, as well as other embodiments, are intended to be included within the scope of the appended claims. Example embodiments are defined by the following claims, with equivalents of the claims to be included therein.

What is claimed is:

1. A field-effect transistor comprising:
a substrate;
an active region comprising a source region, a drain region, and a channel region, each of the source and drain regions including two end portions along a first direction and a middle portion between the two end portions;
a gate structure disposed above the channel region; and
a first set of halo ion regions, each halo ion region locally formed in the substrate adjacent to one of the end portions of the source region but not formed adjacent to the middle portion of the source region, and a second set of halo ion regions, each halo ion region locally formed in the substrate adjacent to one of the end portions of the drain region but not formed adjacent to the middle portion of the drain region.

2. The field-effect transistor of claim 1, wherein the source and drain regions include impurities having a conductivity type opposite to the conductivity type of impurities included in the halo ion regions.

3. The field-effect transistor of claim 2, wherein the source and drain regions include p-type impurities and the halo ion regions include n-type impurities.

4. The field-effect transistor of claim 3, wherein the p-type impurities include at least one of boron (B), aluminum (Al), gallium (Ga), indium (In), and thallium (Tl).

5. The field-effect transistor of claim 3, wherein the n-type impurities include at least one of nitrogen (N), phosphorus (P), arsenic (As), antimony (Sb), and bismuth (Bi).

6. The field-effect transistor of claim 1, wherein the halo ion regions have an impurity concentration ranging from about $1E13$ ions/cm$^2$ to about $1E15$ ions/cm$^2$.

7. The field-effect transistor of claim 1, further comprising lightly doped drain (LDD) regions that includes the same type impurities as the source and drain regions at a lower impurity concentration.

8. The field-effect transistor of claim 7, wherein the lightly doped drain (LDD) regions are each disposed between an end portion of a source or drain region and an adjacent halo ion region.

9. A semiconductor memory comprising:
a substrate;
a plurality of active regions in the substrate each comprising a source region, a drain region, and a channel region, each source region and drain region including two end portions along a first direction and a middle portion between the two end portions, wherein the channel region is disposed between the source and drain regions;
a plurality of gate structures, each gate structure disposed above a respective channel region,
wherein each set of a source region, drain region, channel region, and gate structure comprises a field effect transistor, such that the semiconductor memory includes a plurality of field effect transistors including at least a first field effect transistor and a second field effect transistor;
the first field-effect transistors comprising first halo ion regions that are locally formed adjacent to both end portions of a first source region and a first drain region in the substrate, but not formed adjacent to the middle portion of the first source region or the first drain region; and
the second field-effect transistor comprising second halo ion regions, one adjacent to a second source region and another adjacent to a second drain regions in the substrate, wherein each second halo ion region is continuously formed from one end of the respective second source or second drain region to another end of the respective second source or second drain region along the first direction.

10. The semiconductor memory of claim 9, wherein the first source and first drain regions include impurities having a conductivity type opposite to the conductivity type of impurities included in the first halo ion regions.

11. The semiconductor memory of claim 10, wherein the first source and first drain regions include p-type impurities and the first halo ion regions include n-type impurities.

12. The semiconductor memory of claim 9, wherein the second source and second drain regions include impurities having a conductivity type opposite to the conductivity type of impurities included in the second halo ion regions.

13. The semiconductor memory of claim 9, wherein one or all of the first and second halo ion regions have an impurity concentration ranging from about $1E13$ ions/cm$^2$ to about $1E15$ ions/cm$^2$.

14. The semiconductor memory of claim 9, wherein at least one of the gate structures is a gate structure of a static random access memory (SRAM) cell or a dynamic random access memory (DRAM) cell including a gate insulating layer and a gate electrode.

15. The semiconductor memory of claim 9, wherein at least one of the gate structures is a gate structure of a nonvolatile memory cell including a tunneling insulation layer, a charge storage layer, a blocking insulation layer, and a gate electrode.

16. The semiconductor memory of claim 9, wherein the one or more first field-effect transistors further each comprise at least one lightly doped drain (LDD) region that includes the same type of impurities as the source and drain regions at a lower impurity concentration.

17. The semiconductor memory of claim 9, wherein the one or more second field-effect transistors further each comprise at least one lightly doped drain (LDD) region that include the same type impurities as the source and drain regions at a lower impurity concentration.

18. The semiconductor memory of claim 17, wherein each of the one or more lightly doped drain (LDD) regions is disposed between a second source or drain region, and a respective second halo ion region.

19. A memory card comprising:
   a memory comprising:
      first and second field-effect transistors;
      wherein the first field-effect transistor and second field-effect transistor each comprises a substrate, an active region comprising source and drain regions each having two end portions along a first direction and a middle portion between the two end portions and a channel region formed between the source region and drain region in the substrate, and a gate structure disposed above the channel region,
      wherein the first field-effect transistor comprises first halo ion regions locally formed adjacent to the end portions of the source and drain regions in the substrate, but not formed adjacent to the middle portions of the source or drain region, and
      wherein the second field-effect transistor comprises second halo ion regions that are adjacent to the source and drain regions in the substrate and are continuously formed from one end of each source or drain region to another end of the source or drain region along the first direction; and
   a controller configured to control the memory and to communicate data with the memory.

20. A system comprising:
   a memory comprising:
      first and second field-effect transistors;
      wherein the first and second field-effect transistors each comprises a substrate, an active region comprising a source region and a drain region each having two end portions along a first direction and a portion between the two end portions and a channel region formed between the source region and the drain region in the substrate, and a gate structure disposed above the channel region,
      wherein the first field-effect transistor comprises four first halo ion regions each locally formed adjacent to a respective end portion of a first source or drain region in the substrate, but not formed adjacent to the portions of the first source or drain regions between the two end portions, and
      wherein the second field-effect transistor comprises two second halo ion regions, each adjacent to a respective second source or drain region in the substrate and continuously formed from one end of the respective second source or drain region to another end of the respective second source or drain region along the first direction;
   a processor configured to communicate with the memory through a bus; and
   an input/output apparatus configured to communicate with the bus.

* * * * *